United States Patent [19]

Zachrei

[11] Patent Number: 5,052,565

[45] Date of Patent: Oct. 1, 1991

[54] DEVICE FOR FASTENING A C-SHAPED MOUNTING RAIL TO A WALL PROVIDED WITH SCREW HOLES

[75] Inventor: Jurgen Zachrei, Dillenburg-Nanzenbach, Fed. Rep. of Germany

[73] Assignee: Rittal-Werk Rudolf Loh GmbH & Co. KG, Fed. Rep. of Germany

[21] Appl. No.: 579,623

[22] Filed: Sep. 7, 1990

[30] Foreign Application Priority Data

Sep. 9, 1989 [DE] Fed. Rep. of Germany ....... 3930161

[51] Int. Cl.⁵ ............................................. A47F 5/14
[52] U.S. Cl. .................................. 211/182; 211/192; 211/26; 403/297; 403/254
[58] Field of Search .................. 211/192, 191, 182, 26; 403/297, 254, 255, 199

[56] References Cited

U.S. PATENT DOCUMENTS

| | | | |
|---|---|---|---|
| 3,747,885 | 7/1973 | Ciancimino | 211/182 X |
| 3,897,876 | 8/1975 | Feldman | 211/182 X |
| 4,569,451 | 2/1986 | Parrott et al. | 211/191 |
| 4,867,596 | 9/1989 | Ocuin | 403/297 X |

FOREIGN PATENT DOCUMENTS

| | | |
|---|---|---|
| 0146071 | 6/1985 | European Pat. Off. . |
| 8805118 | 7/1988 | Fed. Rep. of Germany . |
| 2184345 | 6/1987 | United Kingdom .................. 211/26 |

*Primary Examiner*—Blair M. Johnson
*Attorney, Agent, or Firm*—Speckman & Pauley

[57] ABSTRACT

The invention relates to a device for fastening the end of a C-shaped mounting rail to a wall with holes of a control cabinet or of a frame piece of a control cabinet frame, having a fastening block which can be inserted into the end of the rail and which is adapted to the inside cross section of the mounting rail and fastened to the wall by means of a fastening screw. Fastening of the mounting rail only from the fastening side of the wall is achieved by the wall having a row of rectangular or square cutouts and, placed between them and offset by one-half spacing, a row of screw holes. The fastening block is closed off with a fastening plate on the side facing the wall. The fastening plate has an L-shaped hanger on the side facing the wall, which is adapted to the cutouts and the thickness of the wall and can be hung in a cutout. The fastening plate has a screw hole outside of the fastening block for receiving of a fastening tap screw, which can be screwed into a screw hole in the wall when the fastening plate has been hung.

13 Claims, 1 Drawing Sheet

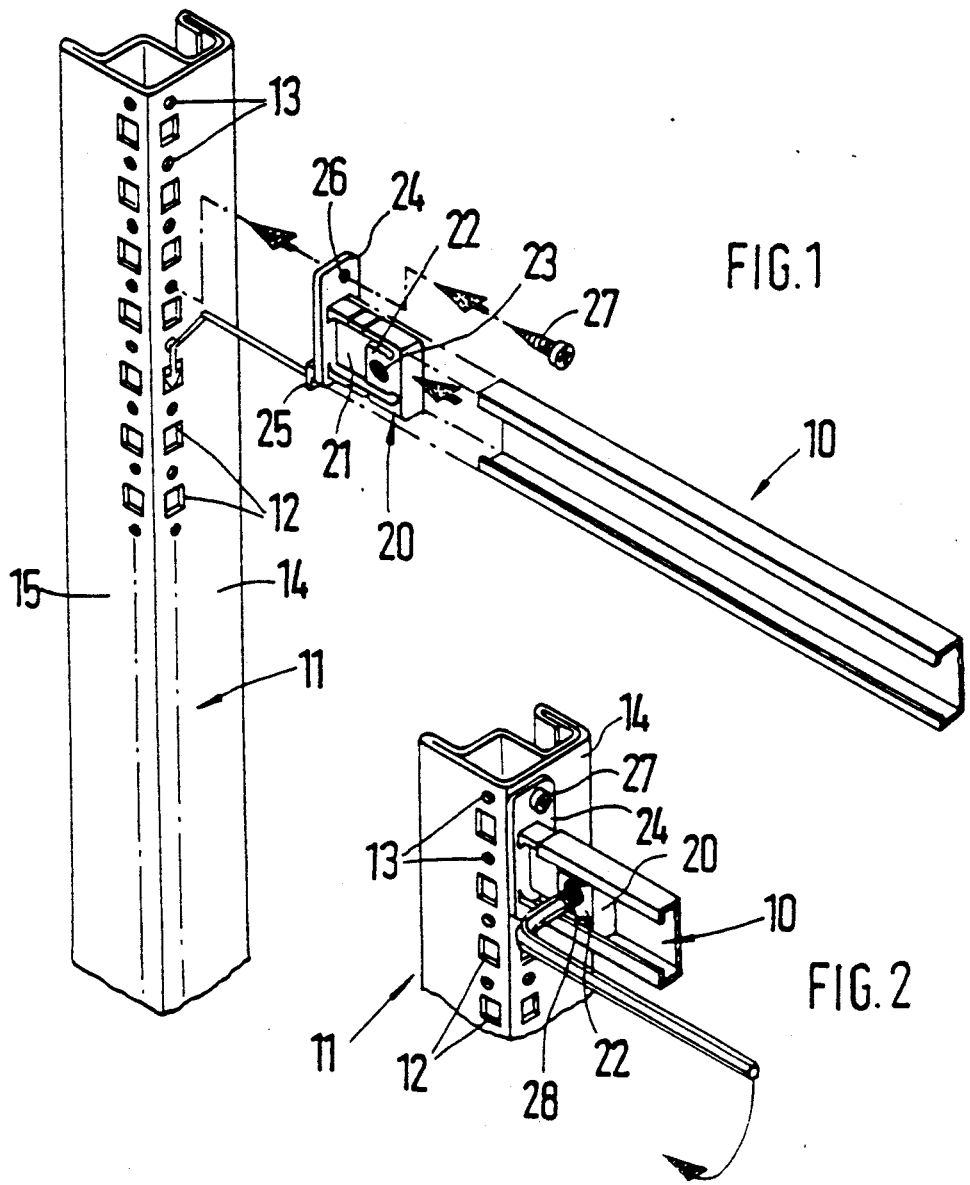

DEVICE FOR FASTENING A C-SHAPED MOUNTING RAIL TO A WALL PROVIDED WITH SCREW HOLES

BACKGROUND OF THE INVENTION

1. Field of the Invention

The invention relates to a device for fastening the end of a C-shaped mounting rail to a wall with holes of a control cabinet or to a wall with holes of a frame piece of a control cabinet frame. The device has a fastening block which can be inserted into the end of the rail, which is adapted to the inside cross section of the mounting rail and which can be fastened to the wall by means of a fastening screw.

2. Description of the Prior Art

A similar device is known from German Utility Model DE-GM 88 05 118. In this known device the fastening block is provided with a stop plate limiting the insertion movement of the fastening block in the inner receptacle of the mounting rail. The side of the stop plate facing the wall includes the fastening screw hole for the fastening screw, which is inserted into the screw hole in the wall from the backside of the wall and screwed into the fastening screw hole of the fastening block. This requires that the wall with the screw holes must be accessible from the back. But this is not always the case. An example would be the fastening of a mounting rail to a frame of a control cabinet, where the screw holes are provided in a wall of the frame which essentially is composed of rectangular profile sections which are not accessible from the interior of the rectangular profile sections.

SUMMARY OF THE INVENTION

The object of the invention is to provide a device of the type mentioned above, where the fastening of the end of a mounting rail to a wall with screw holes is easily done when this wall is only accessible from the fastening side.

This object is attained in accordance with the invention where the wall has a row of rectangular or square cutouts and, placed between them and offset by one-half spacing, a row of screw holes. The fastening block is closed off with a fastening plate on the side facing the wall. The fastening plate has an L-shaped hanger on the side facing the wall, which is adapted to the cutouts and the thickness of the wall and can be hung in a cutout. The fastening plate has a screw hole for receiving a fastening tap screw outside of the fastening block, which can be screwed into a screw hole in the wall when the fastening plate has been hung.

Because the wall is provided with rows of interspersed cutouts and screw holes, the fastening block can first be hung from the fastening side in a cutout of the wall by means of the hanger of the fastening plate. Then the fastening plate is screwed with the fastening screw into the appropriately offset screw hole of the wall. In this case the fastening screw must be self-tapping in order to be sufficiently well seated in the screw hole.

In accordance with one embodiment of this invention, where the fastening block has a U-shaped recess which defines a square nut with a threaded bore on three sides, and where the threaded bore is directed crosswise to the longitudinal axis of the mounting rail and vertically to the base leg of the same and receives a tensioning screw for the axial seating of the fastening block in the mounting rail, it is possible to fasten the mounting rail without axial play between two walls. This has the additional advantage that the mounting rail, which is cut into sections, does not need to be exactly adapted to the distance between the two walls.

To prevent lateral play of the mounting rail, it is provided in accordance with a further embodiment that the legs of the L-shaped fastener have a width adapted to the associated size of the cutouts. Hanging, together with screw fastening, results in fixing the mounting rail so it cannot twist. The device can be designed and made in a simple way in that the fastening plate with the hanger is made of one piece with the fastening block. In this connection it has been preferably provided that the fastening block with the square nut and the fastening plate be formed as a metal-cast component, in particular an injection die-cast metal component.

Handling of the device is made easier by rounding of the corners of the fastening plate.

In another embodiment of the invention, the weight of the fastening block can be reduced to a minimum by using a U-shaped cutout leaving the fastening block open, so that only two pieces of its frame remain, supporting the square nut.

Variations in the dimensions of the interior cross section of the mounting rail can be compensated for the most part by providing the outsides of the fastening block frame pieces with crosswise directed grooves, fins, or the like.

The invention will be described in detail by means of an exemplary embodiment shown in the drawings.

BRIEF DESCRIPTION OF THE DRAWINGS

FIG. 1 is an exploded view of the parts for fastening the end of a C-shaped mounting rail on a piece of the frame of a control cabinet, and FIG. 2 shows the completed connection with the axial fixing of the mounting rail.

DETAILED DESCRIPTION OF PREFERRED EMBODIMENTS

Only a section of the C-shaped mounting rail 10 is shown in FIG. 1, the left end of which is intended to be fastened to the piece of a frame of a control cabinet. The right end of the mounting rail 10 may be fastened in the same way to another piece of the same frame disposed at a distance.

The device has a cuboid fastening block 20 adapted to the interior cross section of the mounting rail 10, which can be inserted into the interior of the mounting rail 10 until the fastening plate 24 abuts the end of the rail. The U-shaped recess 21 defines the square nut 22, into which the threaded bore 23 has been cut, in the fastening block 20. This threaded bore 23 extends crosswise to the longitudinal axis of the mounting rail 10 and vertically to the base leg of the mounting rail. Thus the square nut 22, the two frame pieces, and the fastening plate 24 form one piece. The fastening plate 24 extends on at least one short side beyond the mounting rail 10 and has in this area the screw hole 26 for the fastening screw 27. The long sides of the fastening plate 24 can end flush with the facing exteriors of the mounting rail 10. The L-shaped hanger 25 is formed out of the fastening plate 24 on its side facing the wall 14 of the frame piece 11. A row of square cutouts 12, arranged with regular spacing, has been cut in each of the walls 14 and 15 of the frame piece 11. A row of threaded holes 13 has been cut in each one of these rows of cutouts 12, which are each offset by one-half space in respect to the cutouts 12. If the hangers 25 have a width which corresponds to the length of the sides of the cutouts 12, the fastening block 20 can be hung in a cutout 12.

The L-shaped hanger 25 is disposed on the fastening plate 24 with its end leg protruding at a distance which corresponds to the thickness of the wall 14. The screw hole 26 in the fastening plate 24 is matched with the hanger 25 in such a way that, in the hung position, the screw hole 26 of the fastening plate 24 is aligned with the screw hole 13 in the wall 14, which has been offset by ½ spacings in respect to the cutout 12 in which the hanger 25 is hung. In this way the fastening block 20 and with it the mounting rail 10 supported by the fastening block 20 is supported in the frame piece 11 in a way that it cannot be twisted, in spite of only a single screw connection. The threaded bore 23 in the square nut 22 is accessible through the slit in the mounting rail 10 and it is therefore possible for the tensioning screw 28, formed as a headless screw with a hexagon socket, to fix the mounting rail 10 axially non-movable on the fastening block 20, so that the mounting rail 10 can have substantial axial play on the fastening block 20 before the tensioning screw 28 is tightened. When the mounting rail 10 is fastened at both ends, this play permits both hangers 25 to be hung in the associated frame pieces. Axial fixing by means of the tension screws can take place after fastening of the fastening plates.

In place of the frame pieces 11 any other wall of the control cabinet may be used for fastening of mounting rails, as long as it has rows of cutouts 12 and screw holes 13.

I claim:

1. A device for fastening an end of a C-shaped mounting rail to a wall with holes of one of a control cabinet and a frame piece of said control cabinet frame, having a fastening block which is inserted into said end and is adapted to an inside cross section of said mounting rail and is fastened by means of a fastening screw in said wall, the improvement comprising:

said wall (14) having a first row of rectangular cutouts (12) and, having between said cutouts and being offset by one-half spacing, a second row of screw holes (13), said fastening block (20) being closed off with a fastening plate (24) on a side facing said wall (14), said fastening plate (24) having an L-shaped hanger (25) on said side facing said wall (14) adapted to said cutouts (12) and a thickness of said wall (14) and hung in said cutout (12), said fastening plate (24) having a screw hole (26) positioned outside of said fastening block (20) for a fastening tap screw (27) which can be screwed into one of said screw holes (13) in said wall (14) when said fastening plate (24) has been hung, said fastening block (20) having a U-shaped recess (21) which defines a square nut (22) with a threaded bore (23) on three sides, and said threaded bore (23) being directed crosswise to a longitudinal axis of said mounting rail (10) and vertically to a base leg of said mounting rail and receiving a tensioning screw (28) for an axial seating of said fastening block (20) in said mounting rail (10).

2. A device in accordance with claim 1, wherein said fastening block (20) with said square nut (22) and said fastening plate (24) is formed as a metal-cast component.

3. A device in accordance with claim 1, wherein legs of said L-shaped hanger (25) have a width adapted to an associated size of said cutouts (12).

4. A device in accordance with claim 3, wherein said fastening plate (24) with said hanger (25) is integral to said fastening block (20).

5. A device in accordance with claim 4, wherein corners of said fastening plate (24) are rounded off.

6. A device in accordance with claim 5, wherein said recess (21) forms a cutout leaving said fastening block (20) open and a frame of two pieces supporting said square nut (22).

7. A device in accordance with claim 6, wherein outsides of said two frame pieces are provided with crosswise oriented grooves, fins, or the like.

8. A device in accordance with claim 7, wherein said fastening block (20) with said square nut (22) and said fastening plate (24) is formed as a metal-cast component.

9. A device in accordance with claim 1, wherein legs of said L-shaped hanger (25) have a width adapted to an associated size of said cutouts (12).

10. A device in accordance with claim 1, wherein said fastening plate (24) with said hanger (25) is integral to said fastening block (20).

11. A device in accordance with claim 1, wherein corners of said fastening plate (24) are rounded off.

12. A device in accordance with claim 1, wherein said recess (21) forms a cutout leaving said fastening block (20) open and a frame of two pieces supporting said square nut (22).

13. A device in accordance with claim 1, wherein outsides of said two frame pieces are provided with crosswise oriented grooves, fins, or the like.

* * * * *